US011954562B2

(12) United States Patent
Reagor et al.

(10) Patent No.: US 11,954,562 B2
(45) Date of Patent: Apr. 9, 2024

(54) MODULAR CONTROL IN A QUANTUM COMPUTING SYSTEM

(71) Applicant: Rigetti & Co, LLC, Berkeley, CA (US)

(72) Inventors: Matthew J. Reagor, San Rafael, CA (US); William J. Zeng, Berkeley, CA (US); Michael Justin Gerchick Scheer, Oakland, CA (US); Benjamin Jacob Bloom, Oakland, CA (US); Nikolas Anton Tezak, Oakland, CA (US); Nicolas Didier, Berkeley, CA (US); Christopher Butler Osborn, Oakland, CA (US); Chad Tyler Rigetti, Walnut Creek, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 64 days.

(21) Appl. No.: 17/549,434

(22) Filed: Dec. 13, 2021

(65) Prior Publication Data
US 2022/0366288 A1    Nov. 17, 2022

Related U.S. Application Data

(63) Continuation of application No. 15/911,964, filed on Mar. 5, 2018, now Pat. No. 11,200,508.
(Continued)

(51) Int. Cl.
*G06F 8/40* (2018.01)
*G06F 15/76* (2006.01)
(Continued)

(52) U.S. Cl.
CPC ............ *G06N 10/00* (2019.01); *G06F 15/76* (2013.01); *G06F 15/82* (2013.01); *H03K 19/195* (2013.01)

(58) Field of Classification Search
CPC .......... G06N 10/00; G06F 15/76; G06F 15/82; H03K 19/195
See application file for complete search history.

(56) References Cited

U.S. PATENT DOCUMENTS 9,727,824 B2 *   8/2017   Rose .................. G06V 10/772
9,875,444 B2 *   1/2018   King .................. G06F 15/76
(Continued)

FOREIGN PATENT DOCUMENTS

CN          105164705          12/2015
TW          202338670 A  *     10/2022
(Continued)

OTHER PUBLICATIONS

AUIPO, First Examination Report dated Dec. 15, 2021, in AU 2018230642, 3 pgs.
(Continued)

*Primary Examiner* — Cheng Yuan Tseng
(74) *Attorney, Agent, or Firm* — Henry Patent Law Firm PLLC

(57) ABSTRACT

In a general aspect, a quantum computing method is described. In some aspects, a control system in a quantum computing system assigns subsets of qubit devices in a quantum processor to respective cores. The control system identifies boundary qubit devices residing between the cores in the quantum processor and generates control sequences for each respective core. A signal delivery system in communication with the control system and the quantum processor receives control signals to execute the control sequences, and the control signals are applied to the respective cores in the quantum processor.

18 Claims, 3 Drawing Sheets

Related U.S. Application Data

(60) Provisional application No. 62/469,999, filed on Mar. 10, 2017.

(51) Int. Cl.
*G06F 15/82* (2006.01)
*G06N 10/00* (2022.01)
*H03K 19/195* (2006.01)

(56) References Cited

U.S. PATENT DOCUMENTS

| | | | |
|---|---|---|---|
| 10,318,881 B2 * | 6/2019 | Rose | G06N 10/00 |
| 10,346,748 B2 * | 7/2019 | Aspuru-Guzik | G06N 10/00 |
| 10,459,871 B2 * | 10/2019 | Funahashi | G11C 5/066 |
| 10,599,988 B2 * | 3/2020 | Thom | G06N 10/00 |
| 10,720,563 B1 | 7/2020 | Evan et al. | |
| 10,748,601 B2 * | 8/2020 | Kim | G11C 7/1066 |
| 11,144,689 B1 * | 10/2021 | Cowtan | G06F 30/327 |
| 11,200,508 B2 * | 12/2021 | Reagor | G06F 15/76 |
| 11,250,190 B2 * | 2/2022 | Pednault | G06F 17/16 |
| 11,468,293 B2 * | 10/2022 | Chudak | G06N 3/045 |
| 11,481,669 B2 * | 10/2022 | Rolfe | G06N 3/044 |
| 11,526,793 B2 * | 12/2022 | Daraeizadeh | G06T 15/005 |
| 11,574,030 B1 * | 2/2023 | Harrigan | G06N 10/20 |
| 11,593,695 B2 * | 2/2023 | Bernoudy | G06N 10/00 |
| 2004/0173792 A1 | 9/2004 | Blais et al. | |
| 2006/0101236 A1 | 5/2006 | Han | |
| 2006/0248618 A1 | 11/2006 | Berkley | |
| 2007/0239366 A1 | 10/2007 | Hilton et al. | |
| 2008/0185576 A1 | 8/2008 | Hollenberg et al. | |
| 2009/0014714 A1 | 1/2009 | Koch | |
| 2014/0365843 A1 | 12/2014 | Ashikhmin | |
| 2016/0112066 A1 | 4/2016 | Ashikhmin | |
| 2016/0267032 A1 | 9/2016 | Rigetti et al. | |
| 2017/0230050 A1 | 8/2017 | Rigetti et al. | |
| 2017/0286858 A1 | 10/2017 | La Cour et al. | |
| 2018/0260730 A1 * | 9/2018 | Reagor | H03K 19/195 |
| 2018/0322409 A1 | 11/2018 | Barends | |
| 2019/0156239 A1 | 5/2019 | Martinis et al. | |
| 2020/0058702 A1 | 2/2020 | Kelly et al. | |
| 2020/0258000 A1 | 8/2020 | Barends et al. | |
| 2020/0278903 A1 | 9/2020 | Fowler | |
| 2020/0364598 A1 | 11/2020 | Ashikhmin | |
| 2021/0035007 A1 | 2/2021 | Barends et al. | |
| 2021/0357797 A1 * | 11/2021 | Karalekas | G06N 10/80 |
| 2022/0019931 A1 * | 1/2022 | Jiang | G06N 10/20 |
| 2022/0084085 A1 * | 3/2022 | Rigetti | G06Q 30/0283 |
| 2022/0164501 A1 * | 5/2022 | Nosanow | G06N 10/60 |
| 2022/0366288 A1 * | 11/2022 | Reagor | H03K 19/195 |

FOREIGN PATENT DOCUMENTS

| | | |
|---|---|---|
| WO | 2005122052 | 12/2005 |
| WO | 2018165021 | 9/2018 |

OTHER PUBLICATIONS

EPO, Extended European Search Report dated Dec. 17, 2020, in EP 18764432.3, 10 pgs.
KIPO, International Search Report and Written Opinion of the ISA dated Jul. 10, 2018, in PCT/US2018/020915, 11 pgs.
USPTO, Non-Final Office Action dated May 26, 2021, in U.S. Appl. No. 15/911,964, 25 pgs.
USPTO, Third Party Submission filed Nov. 16, 2018, in U.S. Appl. No. 15/911,964, 37 pgs.
USPTO, Notice of Allowance dated Sep. 17, 2021, in U.S. Appl. No. 15/911,964, 5 pgs.
Ahn, et al., "Continuous quantum error correction via quantum feedback control", Physical Review A, vol. 65, 042301, Mar. 14, 2002, 10 pgs.
Barends, et al., "Superconducting quantum circuits at the surface code threshold for fault tolerance", Nature 508, 2014, pp. 500-503.
Egger, D. J., et al., "Adaptive Hybrid Optimal Quantum Control for Imprecisely Characterized Systems", Phys. Rev. Lett. 112, 240503, Jun. 20, 2014, 11 pgs.
Kelly, et al., "Scalable in-situ qubit calibration during repetitive error detection", arXiv:1603.03082v1, Mar. 9, 2016, 5 pgs.
Kelly, et al., "Supplementary Information for: Scalable in-situ qubit calibration during repetitive error detection", arXiv:1603.03082v1, Mar. 9, 2016, 3 pgs.
Khaneja, N., et al., "Optimal Control of Coupled Spin Dynamics: Design of NMR Pulse Sequences by Gradient Ascent Algorithms", J. Magn. Reson. 172, 2005, pp. 296-305.
Leung, N., "Speedup for quantum optimal control from GPU-based automatic differentiation", arXiv:1612.04929v2 [quant-ph], Dec. 20, 2016, 14 pages.
Maslov, et al., "Quantum Circuit Simplification and Level Compaction", arXiv:quant-ph/0604001v2, Feb. 27, 2008, 13 pgs.
Monroe, C., et al., "Large-scale modular quantum-computer architecture with atomic memory and photonic interconnects", Phys Rev. A, 89 022317, 2014, 16 pgs.
Motzoi, F., et al., "Simple pulses for elimination of leakage in weakly nonlinear qubits", Phys. Rev. Lett. 103, 110501, Sep. 11, 2009, 4 pgs.
Narla, A., et al., "Robust Concurrent Remote Entanglement Between Two Superconducting Qubits", Phys. Rev. X 6, 031036, 2016, 18 pgs.
Vandersypen, L. M. K., et al., "NMR techniques for quantum control and computation", Rev. Mod. Phys. 76, 1037, 2005, 33 pgs.
Yung, "Processor Core Model for Quantum Computing", Phys. Rev. Lett. 2006, vol. 96, Iss. 22, Article No. 220501.
AUIPO, Examination Report No. 2 dated Dec. 6, 2022, in AU 2018230642, 3 pgs.
EPO, Communication pursuant to Article 94(3) EPC dated Apr. 21, 2023, in EP 18764432.3, 12 pgs.
Maslov, et al., "Quantum Circuit Simplification and Level Compaction", arXiv:quant-ph/0604001v1, Apr. 1, 2006, 14 pgs.
IPAU, Examination Report issued in Application No. 2022287631 dated Sep. 22, 2023, 4 pages.

* cited by examiner

MODULAR CONTROL IN A QUANTUM COMPUTING SYSTEM

CROSS-REFERENCE TO RELATED APPLICATIONS

This application is a continuation of U.S. patent application Ser. No. 15/911,964, entitled "Modular Control in a Quantum Computing System" and filed Mar. 5, 2018, which claims priority to U.S. Provisional Application No. 62/469,999 entitled "Modular Control in a Quantum Computing System" and filed Mar. 10, 2017. The contents of all above-referenced priority applications are hereby incorporated by reference.

BACKGROUND

The following description relates to modular control in a quantum computing system.

Quantum computers can perform computational tasks by executing quantum algorithms. Quantum algorithms are often expressed in terms of quantum logic operations applied to qubits. A variety of physical systems have been proposed as quantum computing systems. Examples include superconducting circuits, trapped ions, spin systems and others.

DETAILED DESCRIPTION

In some aspects of what is described here, a quantum computing system uses modular control for quantum computation. For example, the quantum computing system may leverage software-defined modularity to efficiently compile, calibrate, and execute quantum algorithms. In some cases, a quantum algorithm can be compiled, calibrated and executed using optimal control theory (OCT) routines targeting gates over multiple qubits in a core simultaneously as unitary. Each core may include many qubits (e.g., five, ten, twenty or more qubits), and control sequences can be generated without necessarily tuning up a universal set of individual quantum logic gates. In some cases, the complexity of large-scale quantum operations is reduced or avoided by modularizing the approach to control in-situ.

In some aspects of what is described here, a quantum computing architecture includes all qubits implemented on single-junction transmon qubit devices with static couplings to other qubits, and radio frequency (RF) control drives are applied to the qubits near or on-resonance with a multitude of transitions simultaneously. The control drives can be generated, for example, according to OCT techniques over varying sub-sets of qubits to realize target evolutions as part of executing a quantum algorithm across a larger processor.

Figure 1:
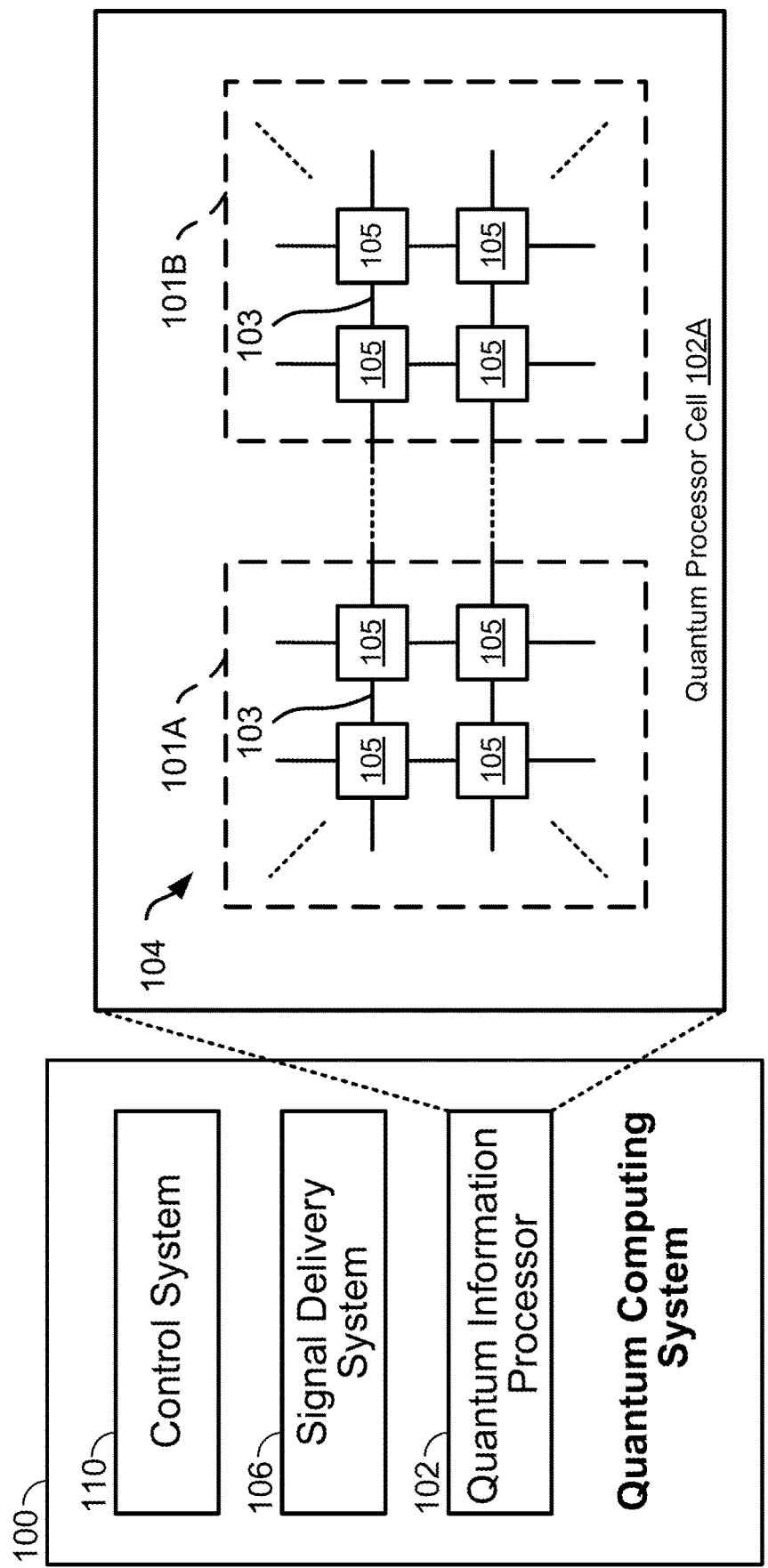
FIG. 1 is a block diagram of an example quantum computing system.

FIG. 1 is a schematic diagram of an example quantum computing system 100. The example quantum computing system 100 shown in FIG. 1 includes a control system 110, a signal delivery system 106, and a quantum information processor 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. In some instances, quantum logic can be performed in a manner that allows large-scale entanglement within the quantum system. Control signals can manipulate the quantum states of individual qubits and the joint states of the multiple qubits. In some instances, information can be read out from the composite quantum system by measuring the quantum states of the individual qubits.

In some implementations, the quantum computing system 100 is constructed and operated according to a scalable quantum computing architecture. For example, in some cases, the architecture can be scaled to a large number of qubits to achieve large-scale general purpose coherent quantum computing. In some instances, the architecture is adaptable and can incorporate a variety of modes for each technical component. For example, the architecture can be adapted to incorporate different types of qubit devices, coupler devices, readout devices, signaling devices, etc.

In some examples, the quantum information processor 102 includes a quantum circuit system. For example, the quantum information processor 102 may include the example quantum circuit system 300 shown in FIGS. 3A and 3B or another type of quantum circuit system. The quantum circuit system may include qubit devices, resonator devices and possibly other devices that are used to store and process quantum information. In some implementations, the quantum circuit system is a superconducting quantum circuit system, in which various circuit elements are capable of operating in a superconducting state. In some implementations, the quantum circuit system is an integrated quantum circuit (e.g., an integrated superconducting quantum circuit).

In some implementations, the example quantum information processor 102 can process quantum information by applying control signals to the qubit devices or to other devices housed in the quantum information processor 102. The control signals can be configured to encode information in the qubit devices, to process the information by performing quantum logic gates or other types of operations, or to extract information from the qubit devices. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a quantum error correction procedure, a quantum state distillation procedure, or a combination of these and other types of operations.

FIG. 1 shows an example quantum information processor 102A that includes a superconducting quantum circuit system 104. The example superconducting quantum circuit system 104 includes circuit devices 105 arranged in a two-dimensional device array. Eight circuit devices are shown in FIG. 1. In some examples, some of the circuit devices 105 are qubit devices that each store a single qubit of information, and the qubits can collectively represent the computational state of a quantum processor. In some cases, the superconducting quantum circuit system 104 may include resonator devices coupled to the respective qubit devices, for instance, where each qubit device includes a superconducting quantum interference device (SQUID) loop and is capacitively coupled to a neighboring resonator device. The readout devices may be configured to generate readout signals that indicate the computational state of the quantum processor. In some examples, some of the circuit devices 105 are coupler devices that selectively operate on individual qubits or pairs of qubits. For example, the coupler devices may produce entanglement or other multi-qubit states over two or more qubits. The superconducting quantum circuit system 104 may include additional devices (e.g., additional qubit devices, coupler devices and other types of devices).

The example quantum circuit system 104 also includes connections 103 between neighboring pairs of the circuit devices 105. The connections 103 can provide electromagnetic communication between the connected circuit devices. In some cases, the connections 103 are implemented as capacitive, conductive or inductive signaling connections. For instance, the connections 103 may include metal traces, capacitors, flux loops and other components. The superconducting circuit devices 105 may be operated by microwave or radio frequency signals delivered in the quantum circuit system 104, for example, from the control system 110. Signals may be exchanged among the circuit devices 105 through the connections 103 or other signal pathways in the quantum circuit system 104.

The circuit devices 105 in the quantum circuit system 104 may be arranged in one or more regular or irregular arrays. For instance, qubit devices may be arranged in a rectilinear (e.g., rectangular or square) array that extends in two spatial dimensions (in the plane of the page), where each qubit device has four nearest-neighbor qubit devices. Qubit devices can be arranged in another type of regular or irregular array (e.g., a hexagonal array). In some instances, the array of circuit devices also extends in a third spatial dimension (in/out of the page), for example, to form a cubic array or another type of regular or irregular three-dimensional array.

The example quantum information processor 102A includes subsets of the circuit devices assigned to respective cores. In FIG. 1, a first core 101A and a second core 101B are shown. The quantum processor cell may include additional cores or different types of cores. Each core includes a subset of the circuit devices 105. For instance, the first core 101A may include a first subset of qubit devices, while the second core 101B may include a second subset of qubit devices. Each subset may include, for example, tens or hundreds of qubit devices. The cores may be defined by hardware, by control logic, by connections, by software or otherwise. In some cases, the cores are dynamically assigned during operation of the quantum computing system 100.

In the example shown in FIG. 1, the signal delivery system 106 provides communication between the control system 110 and the quantum information processor 102. For example, the signal delivery system 106 can receive control signals from the control system 110 and deliver the control signals to the quantum information processor 102. In some instances, the signal delivery system 106 performs preprocessing, signal conditioning, or other operations to the control signals before delivering them to the quantum information processor 102.

In some instances, the signal delivery system 106 receives qubit readout signals from the quantum processor cell and delivers the qubit readout signals to the control system 110. In some instances, the signal delivery system 106 performs preprocessing, signal conditioning or other operations on the readout signals before delivering them to the control system 110.

In some implementations, the signal delivery system 106 includes input and output processing hardware, input and output connections, and other components. The input and processing hardware may include, for example, filters, attenuators, directional couplers, multiplexers, diplexers, bias components, signal channels, isolators, amplifiers, power dividers and other types of components.

In some implementations, the signal delivery system 106 provides connections between different temperature and noise regimes. For example, the quantum computing system 100 may include a series of temperature stages between a higher temperature regime of the control system 110 and a lower temperature regime of the quantum information processor 102.

In the example quantum computing system 100 shown in FIG. 1, the control system 110 controls operation of the quantum information processor 102. The example control system 110 may include data processors, signal generators, interface components and other types of systems or subsystems. In some cases, the control system 110 includes one or more classical computers or classical computing components.

In some implementations, the control system 110 generates control sequences based on a quantum computation to be performed. The control sequences can include a sequence of operations that can be executed by the quantum information processor 102. In some cases, control sequences are generated for the respective cores of the quantum information processor 102. For instance, the control sequence may be generated according to one or more operations in the example process 200 shown in FIG. 2 or in another manner. A control sequence may be translated to control signals (e.g., microwave control signals, optical control signals, DC bias control signals, etc.) that are delivered to the quantum information processor 102, and upon delivery, cause the quantum information processor 102 to execute the quantum computation.

In some instances, the control system 110 uses a modular solution to control the quantum information processor 102. For instance, the control system 110 can consider the quantum information processor 102 to be comprised of multiple cores for computation. As an example, the control system 110 may define the cores 301A, 301B, 301C, 301D shown in FIGS. 3A and 3B. In some cases, each core can include the maximum number of qubits for which gate optimization can be pre-computed, or a core may include another number of qubits. A gate-set may then be calibrated for a full core. For instance, a gate set for a core can be calibrated using brute-force approaches (e.g. Ad-HOC or another technique), and all measurable effects can be considered in the calibration in some cases. The control system 110 can control and modify the mapping of qubits to cores, for example, during the execution of an algorithm. For instance, the cores may be defined or re-defined logically or computationally by the control system 110 without any modification to the hardware in the signal delivery system 106 or the quantum information processor 102. In some cases, the use of modular control, implemented on multiple cores in the quantum information processor 102, can reduce the analytic understanding that is required to actuate gates in a quantum computing system 100.

In some cases, boundary qubits are designated between the cores in the quantum information processor 102. For instance, there may be one or more columns of qubit devices between the first core 101A and the second core 101B in the example quantum circuit system 104 shown in FIG. 1. The control system 110 may control the qubit devices between the cores using control techniques that allow the cores to operate in parallel. In the example shown in FIG. 1, the control system 110 can identify qubit devices in each core that share non-negligible interactions with boundary qubits (qubits not assigned to a core) and apply constraints in the control process. As an example, the control system 110 may require that the target gate evolution for each boundary qubit is identity, and that any excitation in the boundary qubit comes at a large penalty cost to the control optimization criteria. The control system 110 can allow the cores to share a boundary in a "divide-and-conquer" computational process. In some instances, the control technique permits boundary adjustments in an optimization loop, with a simple error syndrome (identity errors of boundary qubits).

In some aspects of operation, the control system 110 prepares an executable instruction set for executing a quantum algorithm using modular core control. The control system 110 can define a gate set over each core in a full-tensor representation, with identity operations on the boundary qubits. The gate set over a core can be defined by a portion of the quantum algorithm to be executed. For each core that includes multiple qubits, the gate set may be defined without single-qubit rotations. Next, each gate in the gate set for each core can be generated, for example, by a numerical optimization process, and closed-loop optimization of the gate set can be executed on the hardware in each core. In some cases, the closed-loop optimization can be re-executed to fix the identity error syndrome. The cores can then be re-defined, and additional gate sets can be defined and optimized until the algorithmic requirements for gate-set are met.

In some cases, the control system 110 compiles the gate sets without adhering to commutation relations between primitive gates to schedule control sequences. For instance, the control system 110 may compute the entire evolution of a core in an algorithm step as the product of all individual operations in the core. A control sequence can be optimized with physical constraints, whose cost function is infidelity to the full process. In some cases, each control sequence is optimized over the Hilbert space defined by the qubits in a core.

In this context, an optimization process can provide a solution based on defined criteria (e.g., a cost function) and does not necessarily provide an absolute optimal solution. Accordingly, a numerically-optimized output may represent an acceptable solution under a set of criteria, rather than an absolute optimal solution. Thus, there may be multiple different numerically-optimized solutions to a given problem, and one solution may be more optimal than another.

In some implementations, the control system uses an optimal control theory (OCT) process to generate or optimize a control sequence for a core. For instance, the GRAPE (Gradient Ascent Pulse Engineering) technique can be used to construct numerically-optimized pulses. Example calibration routines include Adaptive Hybrid Optimal Quantum Control for Imprecisely Characterized Systems (Ad-HOC) and variants thereof. In Ad-HOC, an initial control sequence can be pre-computed through numerical optimization (e.g., using the GRAPE algorithm). The initial control sequence can then be used as a seed into a closed-loop hardware optimization (run on the quantum computing system hardware) to account for non-modeled errors (e.g. signal-chain distortion). In some cases, a quantum computer can be used to bootstrap the OCT routines applied to another quantum computer or to itself.

The control system 110 may place significant computational demands on the numerical optimization process, for instance, to maximize the size of the cores and increase algorithm fidelities. The numerical optimization process can be implemented, for example, on a classical co-computer (supercomputer) or another type of computing resource. In some cases, a quantum computing system can be used to bootstrap optimal control theory (OCT) processes beyond the core size accessible by classical computation.

Figure 2:
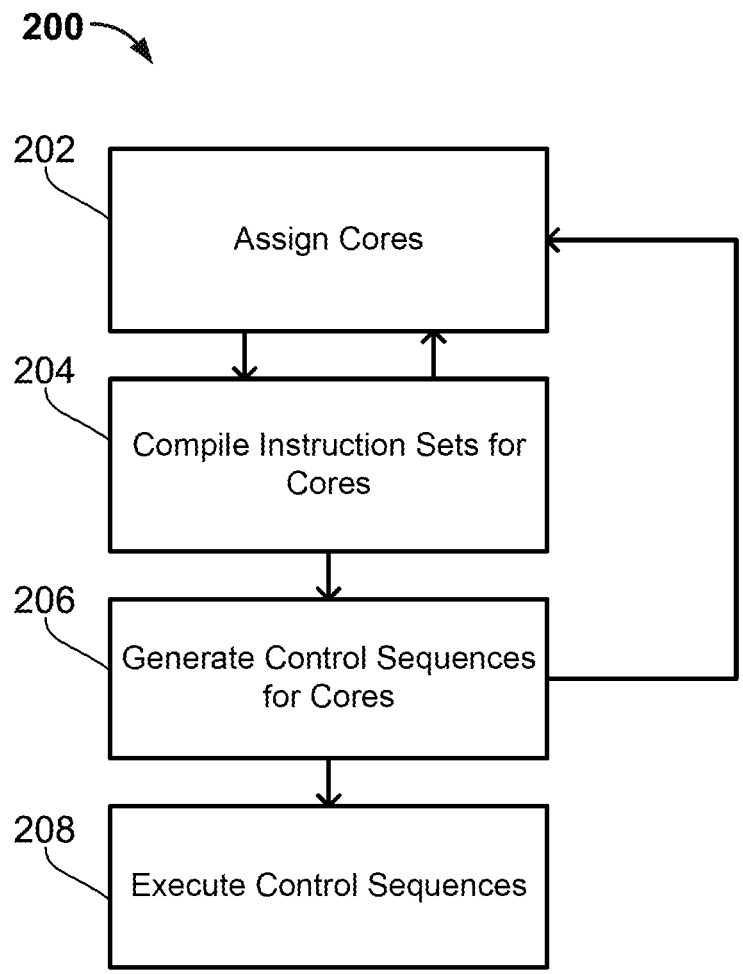
FIG. 2 is a flow chart showing an example quantum computing process.

FIG. 2 is a flow chart showing an example quantum computing process 200. The example quantum computing process 200 can be performed by a quantum computing system, for example, the quantum computing system 100 shown in FIG. 1 or another type of quantum computing system. The process 200 may include additional or different operations, and the operations may be performed in the order shown or in another order. In some cases, multiple operations are combined, performed in parallel or divided into additional operations.

At 202, cores are assigned in the quantum computing system. In some implementations, subsets of qubits defined in a quantum information processor are assigned to respective cores. For example, in FIG. 1, a first subset of the circuit devices 105 are assigned to the first core 101A, and another subset of the circuit devices 105 are assigned to the second core 101B. In some cases, some of the qubits in the quantum information processor are not assigned to a core and instead are designated as boundary qubits.

The cores may be assigned by the control system in the quantum computing system. For example, in FIG. 1, the cores may be assigned by software or logic executed on a processor in the control system 110. In some cases, the cores assignments are stored in memory, for example, for access by a processor in the control system 110.

At 204, instruction sets are compiled for the respective cores. The instruction sets are based on a target quantum algorithm to be executed by the quantum computing system. The target quantum algorithm may be constructed or composed as a sequence of operations that can be executed at the core level of the quantum information processor. An instruction set may be defined for a core, for example, as a target unitary evolution for the core (e.g., a unitary operator over the Hilbert space defined by the qubits assigned to the core, or another form), as a target quantum logic sequence (e.g., a series of quantum logic gates applied for the qubits assigned to the core, or another form), as a target Hamiltonian (e.g., a Hermitian operator over the Hilbert space defined by the qubits assigned to the core, or another form).

In some cases, after compiling (or attempting to compile) instruction sets at 204, the process returns to 202, and the cores are reassigned. For instance, the cores may be reassigned if an instruction set cannot be compiled for a core, if it is determined that an operation cannot be performed with acceptable fidelity, if it is determined that a more optimal core assignment is available, etc. Operations 202 and 204 may be iterated, for example, until an acceptable instruction set is identified or until another terminating criteria is met.

At 206, control sequences are generated for the cores. The control sequences are generated based on the instruction sets identified at 204. The control sequence for a core can include a specification of control signals that cause the core to execute a specific instruction set or gate set, for instance, when the control signals are delivered to the core. The control sequence for a core can be defined such that any boundary qubits that interact with the core are not affected. For example, the control sequence may be configured to apply an identity operation to the boundary qubits.

In some implementations, the control sequences are computed by a numerical optimization process. For example, a numerically-optimized control sequence may be computed by minimizing the infidelity of the predicted evolution to the target unitary evolution ($\hat{U}_n$) over a set of expected control devices for a single core. In some cases, the predicted evolution can be represented as a simulated unitary evolution operator or a simulated superoperator, which may or may not be unitary. The predicted unitary evolution ($\hat{U}_s$) can be generated by numerical simulation, for example. The target unitary evolution ($\hat{U}_n$) can be expressed $$\hat{U}_n = \prod_{b \in B} \hat{U}_b \otimes \prod_{c \in C} \hat{U}_c$$

where ($\hat{U}_b$) represents the target unitary evolution of the boundary qubits (b∈B) and ($\hat{U}_c$) represents the target unitary evolution of the core qubits (c∈C). The ideal unitary evolution of the boundary qubits may be expressed as the identity operation ($\hat{U}_b = \mathbb{I}$) in some cases. In some implementations, other conditions can be applied to the boundary qubits. For example, a boundary-matching problem could be used rather than applying identity operations.

In some implementations, the control sequences are generated by an experimental feedback optimization process. For example, a measurement-optimized control signal may be identified by minimizing the infidelity of the observed evolution to the target unitary evolution ($\hat{U}_n$) over a set of control devices in the quantum information processor. In some cases, the observed evolution can be represented as a measured unitary evolution operator or a measured superoperator, which may or may not be unitary.

In some implementations, when the control sequences are generated, errors are checked on the boundary qubits with multiple cores actuated. Control sequences may be optimized (e.g., experimentally, numerically, or otherwise) to correct for any errors observed on the boundary qubits in some cases.

Figure 3A:
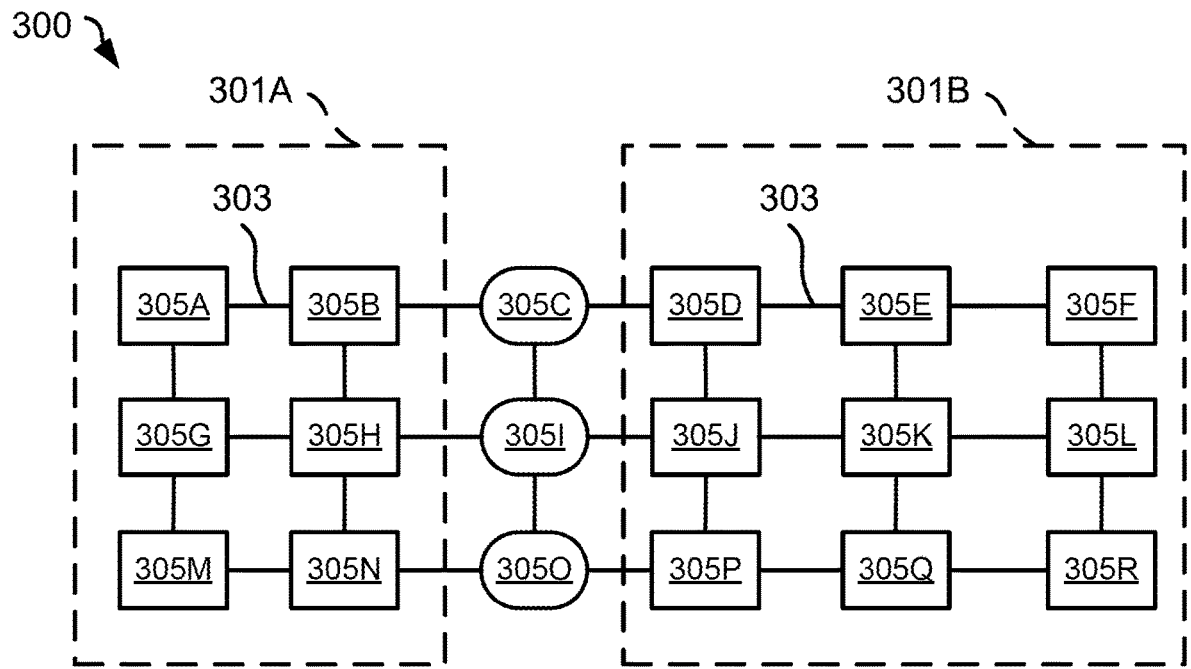
FIGS. 3A and 3B are block diagrams of an example quantum circuit system.
Figure 3B:
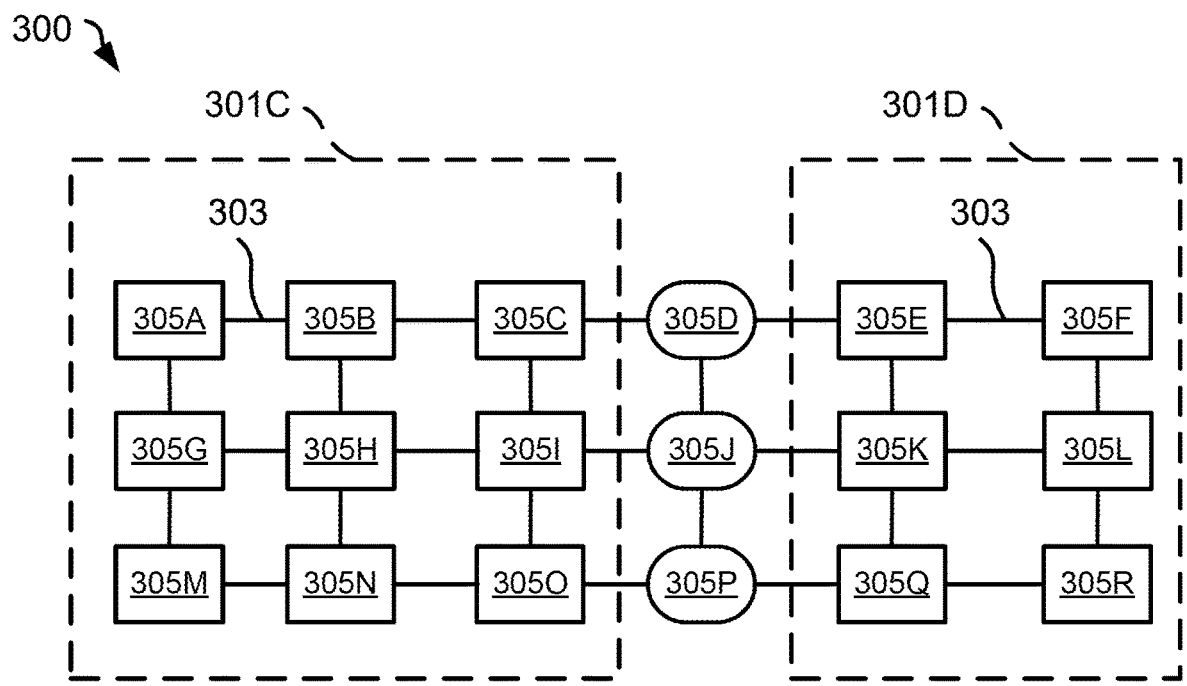

After the control sequence is generated for the cores, the process may return to 202, and the cores may be reassigned for another step in the quantum algorithm. As an example, on a first iteration of the process 200, the cores may be assigned as shown in FIG. 3A for a first step in the quantum algorithm, and on a second iteration of the process 200, the cores may be assigned as shown in FIG. 3B for a second step in the quantum algorithm. In some cases, the core assignments are maintained in the subsequent iteration, and additional instruction sets are compiled for the cores that were assigned on a prior iteration of the process 200. As an example, the cores may be assigned as shown in FIG. 3A for multiple steps in the quantum algorithm.

At 208, the control sequences are executed. The control sequences may be executed, for example, by delivering the specified control signals to the quantum information processor according to a scheduled process. In some cases, the control sequence for each core is executed in parallel. In some cases, control sequences for one or more cores may be executed in series, for instance, according to a scheduled process.

In some cases, all or part of the process 200 can be automated. For example, a quantum algorithm (expressed, for example, as a quantum program written in a quantum programming language) may be loaded onto the control system of the quantum computing system, and the control system can automatically iterate operations 202, 204, 206 until control sequences have been generated to execute the full quantum algorithm. After the control sequences have been generated, the control system may automatically initiate execution of the control sequences. In some cases, the automation utilizes a machine learning process or a data mining process, for example, to utilize previously-generated instruction sets or control sequences for one or more of the cores.

In some cases, the example process 200 in FIG. 2 can provide high degrees of parallelism in gate operation, for example, full parallelism over a core. In some instances, quantum algorithms are compiled to the highest degree of parallelism that is maximally predictable (e.g., classically or otherwise). For instance, it may be possible to implement all N-qubit algorithms in a single step on a core having N qubits. In some cases, core-level compilers are used to increase or maximize the core size, which can increase the accessible range of quantum algorithms in some cases. In some cases, the example process 200 enables a quantum computer to compute at complex, large-scales. For example, fidelities in a range beyond 99.9% may be achieved in a large-scale system. In some cases, the process 200 may be used to tune-up error correcting codes, or other processes that have a similar tiling structure. In some implementations, the example process 200 shown in FIG. 2 can be used to realize operations beyond gate construction, for instance, reading out the expectation values of desired measurement operators given a control Hamiltonian and model for measurement mechanism.

FIGS. 3A and 3B are block diagrams of an example quantum circuit system 300. FIG. 3A shows the quantum circuit system 300 having qubit devices assigned to a first set cores, and FIG. 3B shows the quantum circuit system 300 having the same qubit devices assigned to a second, different set of cores. This multi-step tiling can be implemented, for example, to ensure that a greater number of qubits are utilized in executing a quantum algorithm (e.g., to ensure that boundary qubits are not unused in some cases).

As shown in FIGS. 3A and 3B, the quantum circuit system 300 includes eighteen qubit devices 305A, 305B, 305C, 305D, 305E, 305F, 305G, 305H, 305I, 305J, 305K, 305L, 305M, 305N, 305O, 305P, 305Q 305R. The quantum circuit system 300 may include another number (greater or fewer) qubit devices, and the quantum circuit system 300 may include other types of devices. Connections 303 are represented as lines between neighboring qubit devices in FIGS. 3A and 3B. In FIGS. 3A and 3B, qubit devices assigned to a core are represented as rectangles, and qubit devices that are not assigned to a core are represented as ovals.

In FIG. 3A, qubit devices are assigned to a first core 301A and a second core 301B. In particular, six qubits 305A, 305B, 305G, 305H, 305M, 305N are assigned to the first core 301A, and nine qubits 305D, 305E, 305F, 305J, 305K, 305L, 305P, 305Q, 305R are assigned to the second core 301B. Three of the qubits 305C, 305I, 305O are designated as boundary qubits between the cores 301A, 301B.

In FIG. 3B, qubit devices are assigned to a third core 301C and a fourth core 301D. In particular, nine qubits 305A, 305B, 305C, 305G, 305H, 305I, 305M, 305N, 305O are assigned to the third core 301C, and six qubits 305E, 305F, 305K, 305L, 305Q 305R are assigned to the fourth core 301D. Three of the qubits 305D, 305J, 305P are designated as boundary qubits between the cores 301C, 301D.

In the example shown in FIGS. 3A and 3B, gate sets can be optimized over each of the cores, and identity operations can be targeted for each of the boundary qubits. The gate sets can be optimized, for example, using numerical optimization techniques. In some cases, numerically optimized pulses are simulated and pre-computed (before execution of an algorithm) to provide an initial (in some cases, approximately optimal) execution of the gate set.

In some implementations, the architecture of the quantum circuit system 300 does not include "all-to-all" coupling. Each core may be treated as a fundamental computational unit that can be defined by core assignments in the control system. Operations can be computed and calibrated as an actuation of all of elements in a core. A multitude of cores and a multitude of core-definitions can be actuated to execute a quantum algorithm.

In some implementations, the qubit devices in the quantum circuit system 300 are single-junction (fixed-frequency) transmon qubit devices with static couplings. The entangling operation between linked qubit devices could be implemented by the dispersive Jaynes-Cummings Hamiltonian, which provides an "always-on" controlled phase shift. Optimal Control Theory (OCT) may be used to effectively nullify the entangling phase on the boundary qubits and to steer evolution of each core according to a target quantum algorithm. Imposing a boundary condition within sub-divisions of the processor may allow OCT to scale sufficiently well to control large quantum information processors, for instance, substantially beyond 50 qubits.

In some implementations, the architecture of the quantum circuit system 300 allows universal quantum computation without necessarily sequentially stepping through individually-calibrated single and multi-qubit primitives (quantum logic gates). Instead of calibrating individual gates, transfer functions can be calibrated from control hardware to desired approximately unitary evolution. Algorithms may be executed by maximizing the fidelity to the target evolution of the quantum algorithm step directly. In some instances, quantum algorithms can be defined in a manner that is inherently continuous over the Hilbert space of the qubits in the quantum information processor, rather than being explicitly composed from steps over a finite set of one and multi-qubit gates.

In some cases, a quantum computing system provides tunable couplings between cores, and cores can be reassigned during the execution of the quantum algorithm. In some cases, the techniques described here can be used outside of gate-model quantum computation, for example, in a coherent quantum annealing process.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. Elements of a computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Moreover, a computer can be embedded in another device, e.g., a phone, an electronic appliance, a mobile audio or video player, a game console, a Global Positioning System (GPS) receiver, or a portable storage device (e.g., a universal serial bus (USB) flash drive). Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. In some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

In a general aspect, a quantum computing system can implement modular control.

In a first example, a control system in a quantum computing system assigns subsets of qubit devices in a quantum processor to respective cores. The control system identifies boundary qubit devices residing between the cores in the quantum processor. A signal delivery system, in communication with the control system and the quantum processor, delivers to the quantum processor control signals to execute the control sequences. The control signals are applied to the respective cores in the quantum processor.

In a second example, a quantum computing system includes a quantum processor, a control system, and a signal delivery system. The quantum processor includes an array of qubit devices. The control system is configured to assigning subsets of the qubit devices to respective cores, identify boundary qubit devices residing between the cores in the quantum processor, and generating control sequences for each respective core. The signal delivery system can communicate with the control system and the quantum processor. The signal delivery system is configured to receive, from the control system, control signals to execute the control sequences. The signal delivery system is configured to deliver the control signals to the quantum processor for application to the respective cores.

Implementations of the first or second example may include one or more of the following features. Each of the cores can include a respective subset of qubit devices and additional quantum circuit devices. The additional quantum circuit devices can include coupler devices. The signal delivery system can receive qubit readout signals from the cores and the boundary qubit devices. The control system can generate second control sequences based on the qubit readout signals.

Implementations of the first or second example may include one or more of the following features. Generating control sequences for each respective core can include: determining an identity error syndrome for one or more of the boundary qubit devices; evaluating a cost function based on the identity error syndrome; and generating a control sequence based on a minimization of the cost function. The control sequences can be configured to apply, via the control signals, an identity operation to the boundary qubit devices.

Implementations of the first or second example may include one or more of the following features. Applying the control signals to the respective cores in the quantum processor can include applying the control signals to two or more of the cores in the quantum processor in parallel. Applying the control signals to the respective cores in the quantum processor can include applying the control signals to two or more of the cores in the quantum processor in series.

Implementations of the first or second example may include one or more of the following features. Instruction sets can be identified for the respective cores, and the control sequence for each core can be generated from the instruction set for that core. The instruction set for each core can include a unitary operator defined over a Hilbert space defined by the qubit devices assigned to that core. The instruction set for each core can include a sequence of quantum logic gates for application to the qubit devices assigned to that core. The cores can be a first set of cores, and the control system can reassign the qubit devices from the first set of cores to define a second, distinct set of cores.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:
1. A quantum computing method comprising:
assigning, by operation of a control system in a quantum computing system, subsets of qubit devices in a quantum processor to respective cores, each subset of qubit devices comprising multiple qubit devices;

identifying, by operation of the control system, boundary qubit devices in the quantum processor, the boundary qubit devices being different from the subsets of qubit devices in the quantum processor;

delivering to the quantum processor, by operation of a signal delivery system in communication with the control system and the quantum processor, a first set of control signals;

applying the first set of the control signals to a first subset of the respective cores in the quantum processor for a first iteration of a quantum program;

delivering to the quantum processor, by operation of the signal delivery system, a second set of control signals; and applying the second set of the control signals to a second subset of the respective cores in the quantum processor for a second iteration of the quantum program.

2. The method of claim 1, wherein each of the cores comprises a respective subset of qubit devices and additional quantum circuit devices.

3. The method of claim 2, wherein the additional quantum circuit devices comprise coupler devices.

4. The method of claim 1, wherein applying the first set of control signals to the first subset of the respective cores in the quantum processor comprises applying the first set of control signals to the first subset of the respective cores in the quantum processor in parallel.

5. The method of claim 1, wherein applying the first set of control signals to the first subset of the respective cores in the quantum processor comprises applying the first set of control signals to the first subset of the respective of the cores in the quantum processor in series.

6. The method of claim 1, comprising:
identifying instruction sets for the first and second subsets of the respective cores, wherein a control sequence for each core is generated from a respective instruction set for that core.

7. The method of claim 6, wherein the instruction set for each core comprises a unitary operator defined over a Hilbert space defined by the qubit devices assigned to that core.

8. The method of claim 6, wherein the instruction set for each core comprises a sequence of quantum logic gates for application to the qubit devices assigned to that core.

9. The method of claim 1, comprising:
by operation of the control system, reassigning qubit devices from the first subset of the respective cores to define the second subset of the respective cores.

10. A quantum computing system comprising:
a quantum processor comprising an array of qubit devices;
a control system configured to:
assign subsets of the qubit devices to respective cores, each subset of qubit devices comprising multiple qubit devices; and
identify-boundary qubit devices in the quantum processor, the boundary qubit devices being different from the subsets of qubit devices in the quantum processor; and
a signal delivery system in communication with the control system and the quantum processor, the signal delivery system configured to:
receive, from the control system, a first set of control signals;
deliver the first set of control signals to the quantum processor for application to a first subset of the respective cores;
receive, from the control system, a second set of control signals; and
deliver the second set of control signals to the quantum processor for application to a second subset of the respective cores.

11. The system of claim 10, wherein each of the cores comprises a respective subset of the qubit devices and additional quantum circuit devices.

12. The system of claim 11, wherein the additional quantum circuit devices comprise coupler devices.

13. The system of claim 10, wherein the quantum processor is configured to apply the first set of control signals to the first subset of the respective cores in the quantum processor in parallel.

14. The system of claim 10, wherein the quantum processor is configured to apply the first set of control signals to the first subset of the respective cores in the quantum processor in series.

15. The method of claim 1, further comprising:
prior to delivering to the quantum processor the first set of control signals, generating, by operation of the control system, first control sequences for the first subset of the respective cores, wherein the first set of control signals are based on the first control sequences.

16. The method of claim 15, further comprising:
receiving, by operation of the signal delivery system, from the quantum processor, qubit readout signals from the first subset of the respective cores; and
prior to delivering to the quantum processor the second set of control signals, generating, by operation of the control system, second control sequences based on the qubit readout signals, wherein the second set of control signals are based on the second control sequences.

17. The method of claim 15, wherein generating the first control sequences comprises:
determining an identity error syndrome for one or more of the boundary qubit devices;
evaluating a cost function based on the identity error syndrome; and
generating the first control sequences based on a minimization of the cost function.

18. The method of claim 15, wherein the first control sequences are configured to apply, via the first set of control signals, an identity operation to the boundary qubit devices.

* * * * *